(12) United States Patent
Richley

(10) Patent No.: US 6,586,999 B2
(45) Date of Patent: Jul. 1, 2003

(54) ULTRA WIDEBAND TRANSMITTER WITH GATED PUSH-PULL RF AMPLIFIER

(75) Inventor: Edward Richley, Gaithersburg, MD (US)

(73) Assignee: Multispectral Solutions, Inc., Germantown, MD (US)

( * ) Notice: Subject to any disclaimer, the term of this patent is extended or adjusted under 35 U.S.C. 154(b) by 83 days.

(21) Appl. No.: 09/901,897

(22) Filed: Jul. 11, 2001

(65) Prior Publication Data

US 2003/0011433 A1 Jan. 16, 2003

(51) Int. Cl.$^7$ ............................................ H03F 3/26
(52) U.S. Cl. ..................... 330/276; 330/301; 330/124 R
(58) Field of Search .............................. 330/124 R, 84, 330/276, 266

(56) References Cited

U.S. PATENT DOCUMENTS

| | | | | |
|---|---|---|---|---|
| 5,574,967 A | * | 11/1996 | Dent et al. | 455/12.1 |
| 5,631,604 A | * | 5/1997 | Dent et al. | 330/124 R |
| 5,638,024 A | * | 6/1997 | Dent et al. | 330/124 R |
| 5,732,325 A | * | 3/1998 | Dent et al. | 455/13.3 |
| 5,818,298 A | * | 10/1998 | Dent et al. | 330/124 R |
| 5,842,140 A | * | 11/1998 | Dent et al. | 455/573 |
| 6,026,125 A | * | 2/2000 | Larrick et al. | 375/295 |
| 6,041,416 A | * | 3/2000 | Lada, Jr. | 713/330 |
| 6,191,724 B1 | * | 2/2001 | McEwan | 342/21 |

* cited by examiner

*Primary Examiner*—Michael Tokar
*Assistant Examiner*—Lam T. Mai
(74) *Attorney, Agent, or Firm*—McIntyre Harbin & King LLP

(57) ABSTRACT

A method and an apparatus that reduce power consumption in an ultra wideband (UWB) transmitter that includes a push-pull RF amplifier and a switch that powers up or powers down the amplifier between UWB pulses. The gated push-pull amplifier amplifies the UWB pulses, including spurious signal energy appearing at the detector input, by splitting the signal with a 180-degree phase splitter, amplifying the split signals with substantially identical amplifiers, and combining the amplifier outputs with a 180-degree combiner. The 180-degree combiner essentially cancels common-mode spurious signals typically generated by the UWB amplifier during power-down and power-up.

17 Claims, 6 Drawing Sheets

ULTRA WIDEBAND TRANSMITTER WITH GATED PUSH-PULL RF AMPLIFIER

BACKGROUND

The present invention relates to ultra wideband (UWB) radar, communication, and/or geopositioning. More particularly, the present invention relates to a method and a system that improve UWB pulse transmission in order to enable an accurate measurement of pulse arrival time at a receiver.

UWB wireless technology has increasing application in communications, radar and precision geopositioning systems. A salient feature of UWB is that the transmitter produces short bursts of radio frequency (RF) energy at a relatively low duty cycle. That is, the ratio of the UWB pulse width ($\tau$) to pulse interarrival time (T) is much less than unity, with typical values for $\tau/T$ being in the order of $10^{-3}$ and often significantly less, as illustrated FIG. 1. In a specific UWB radar application, such as the Hummingbird collision avoidance sensor developed by the assignee hereof, a pulse having a width of 2.0 nanoseconds was generated using 500 MHz of instantaneous bandwidth with a pulse interarrival time of 100 microseconds (i e., 10,000 pulses per second). This produced a signal having a pulse duty cycle of $2 \times 10^{-5}$.

A direct consequence of a low duty cycle is that the average power transmitted is significantly lower than the peak power of an individual pulse. Indeed, the ratio of average to peak power is equal to the pulse duty cycle. A system described by Larrick, Jr. et al., in U.S. Pat. No. 6,026,125, incorporated herein, which is also assigned to the assignee hereof, takes advantage of this fact to provide a prime power reduction technique for ultra wideband systems in which "activation of the power amplifier may be time-gated in cadence with the UWB source thereby to reduce inter-pulse power consumption." Reduction of prime (e.g., battery) power is often critical to successful implementation of a wireless system, which typically operates remotely and untethered to a source of power. With power reduction (and, thus, extended battery life), reduced size, weight, and cost are often achieved as well. An additional aspect of the aforementioned '125 patent is the generation of an ultra wideband RF signal by a direct impulse or step excitation of an intermediate or output bandpass filter. Thus, as predicted by the '125 patent, any spurious step, impulse or wideband excitation can itself elicit the generation of spurious RF output energy.

A problem sometimes occurs with time-gated amplifiers as illustrated in FIG. 2. When a gate signal transition turns the amplifier on or off, spurious signal energy is sometimes produced at the amplifier output. Unfortunately, spurious outputs from a UWB transmitter may have a detrimental effect on the operation of a UWB wireless system as shown, for example, in FIGS. 3A and 3B, which illustrate a block diagram and typical waveforms associated with a gated UWB amplifier. Typically, the energy of a spurious signal waveform—itself the result of a fast switching transient—has a very wide bandwidth. If transmitted directly, it may interfere with wireless systems outside of the frequency band of authorization for the UWB source. Alternatively, the wideband spurious signal may also impulse excite the output bandpass filter of a UWB source, resulting in the generation of a spurious in-band RF signal. Such an in-band RF signal may create a false lock condition, which "confuses" the receiver synchronization circuitry in a UWB communication application; or it may produce a false detection event at the receiver, which results in an inaccurate computation of the time-of-flight of a pulse in a UWB precision geopositioning application.

The present invention provides suppression of spurious signals, such as switching transients, that may occur in an ultra wideband gated RF transmitter. This may be analogous to a problem observed in audio frequency amplifiers in which switching transients in the amplifier supply voltage(s) induce spurious outputs that give rise to a loud "pop" or "click" in the audio output. If serious enough, these transients sometimes result in physical damage to either the amplifier or connected speaker circuitry. Typical audio applications, however, do not require precise time gating, transient switching, or an ultra wideband spectrum required of UWB systems.

One solution to the audio amplifier problem has been proposed by U.S. Pat. No. 6,041,416. Typically, an audio amplifier is turned on and off only when the entire system power is turned on and off (e.g., power-down and power-up operations of a computer audio card during power management operations). By contrast, a gated amplifier used in an ultra wideband transmitter can be, and typically is, turned on and off for each arriving pulse to be amplified in order to minimize prime power requirements. In the UWB case, the gating signal often operates at an extremely high frequency (e.g., 100 kHz to several tens of MHz), and typically has an extremely low duty cycle, as described above.

RF push-pull amplifiers are known in the art, as evidenced by U.S. Pat. No. 4,455,536. One configuration of a typical push-pull RF amplifier is shown in FIG. 4. A basic principle of operation involves splitting an input signal into two components that are substantially equal in amplitude but opposite in phase, delivering these oppositely polarized signals to two substantially identical amplifiers, and subsequently recombining the two amplifier outputs into a single composite output signal. RF push-pull amplifiers typically use transformers to split and combine signals, and the transformers can be implemented in a variety of ways, including wire-wound transformers, transmission line transformers, baluns, and hybrid couplers.

In the prior art, several possible reasons exist for using a push-pull amplifier One reason is to increase the total power output by combining the outputs of multiple, smaller power output amplifiers. Another advantage of push-pull amplifiers relates to reducing distortion, as described in *Uniplanar Broad-Band Push-Pull FET Amplifier* by Hsu et al.—IEEE Transactions on Microwave Theory and Techniques, Vol 45, No. 12, December, 1997. A push-pull amplifier balances out even harmonics in the output and will leave the third harmonic as the principal source of distortion, thus possessing inherent spurious signal rejection of even order distortion.

In view of the foregoing, one objective of the present invention is to reduce overall transmitter power consumption by gating a balanced amplifier so that it is in a power-down state during inter-pulse intervals.

A further objective of the invention is to substantially eliminate spurious output signals during power-up and power-down of a UWB amplifier.

SUMMARY OF THE INVENTION

In accordance with the invention, there is provided a method of canceling or reducing spurious or similar output signals associated with a UWB transmitter where a UWB pulse is transmitted during an interval defined by switching events. The preferred method comprises splitting signals appearing at an amplifier input into signals of opposite phase, push-pull amplifying the signals of opposite phase, and combining the amplified signals whereby to reduce or cancel the spurious signals in the combined signal. The method may further include applying power to amplify the signals of opposite phase during push-pull amplifying and gating power applied during the amplifying step in accordance with time instances defining the amplifier switching events.

In accordance with another aspect of the invention, a switched push-pull amplifier free of spurious signal outputs is provided in a UWB pulse transmitter The preferred push-pull amplifier comprises a signal splitter that receives a low-level UWB signal at an input thereof and that divides the input signal into first and second signals having a substantially opposite phase relationship; respective amplifier segments of the push-pull amplifier that amplify the first and second signals to produce first and second amplified signals; a switch that responds to a gate signal to activate the push-pull amplifier; and a combiner that combines the first and second amplified signals to provide a composite output signal, whereby to provide cancellation or reduction of the spurious signal outputs resulting from powering up or powering down the amplifier. The splitter and/or the combiner may be implemented by a wire-wound transformer, a transmission line transformer, a balun, or a hybrid coupler.

The invention advantageously employs a push-pull amplifier or similar spurious signal canceling configuration that preferably operates to cancel or reduce spurious signal outputs before and/or after normal UWB pulse transmission. This permits more effective shut down of the UWB pulse generation or detection circuitry during null periods and start-up during time-gated UWB pulse transmission or detection windows. An important objective being not to increase power, or reduce harmonic distortion, but rather to eliminate the spurious output signals associated with gating an amplifier.

Other features, aspects, and advantages of the invention will become apparent upon review of the following disclosure taken in connection with the accompanying drawings. The invention, though, is pointed out with particularity by the appended claims.

DESCRIPTION OF ILLUSTRATIVE EMBODIMENTS

The exemplary approach described herein for suppressing switching transients in a gated ultra wideband power amplifier is based on a novel implementation of push-pull amplifier circuitry.

Figure 6:
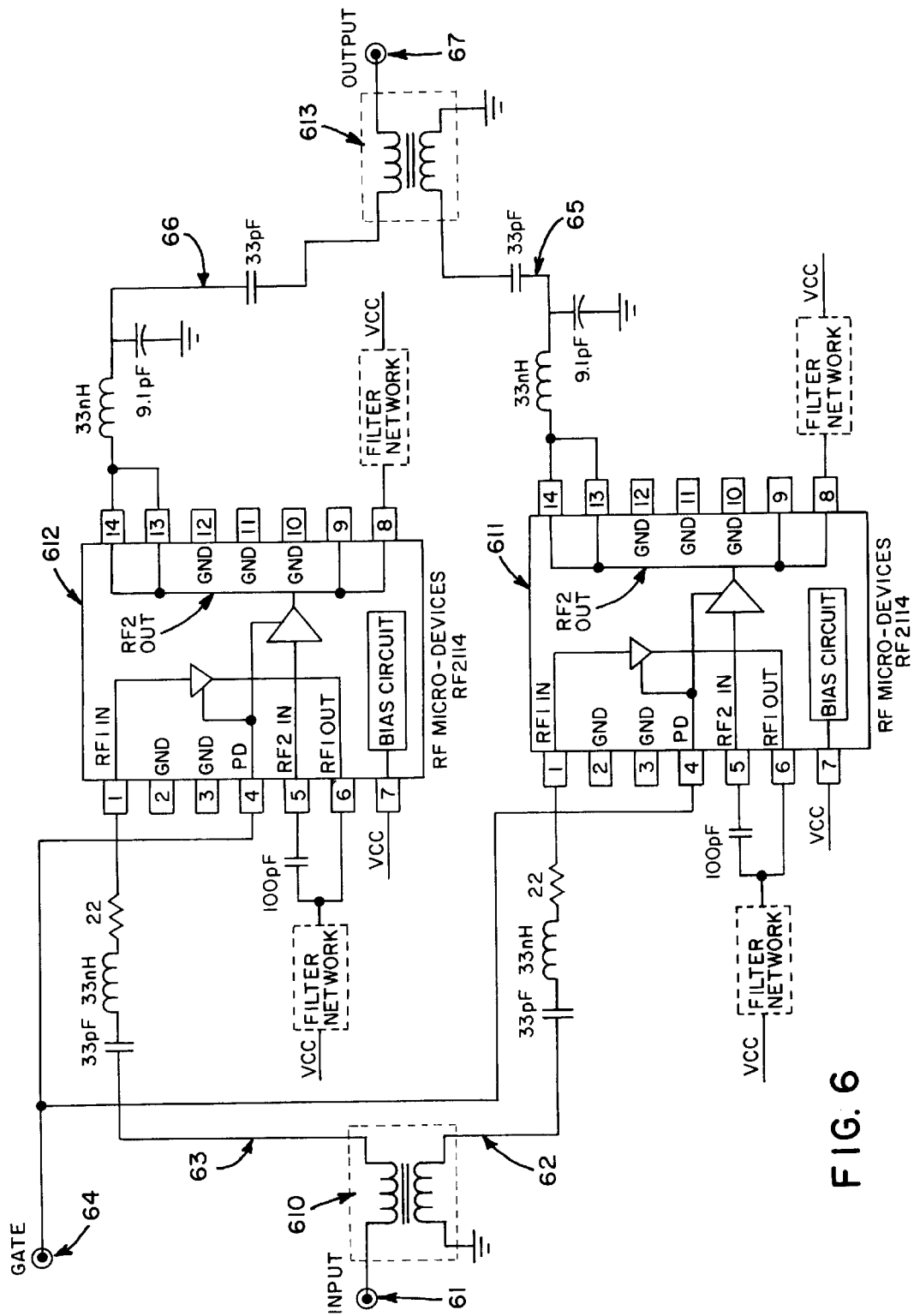
FIG. 6 is a detailed schematic diagram of an exemplary embodiment according to one aspect of the present invention.
Figure 7:
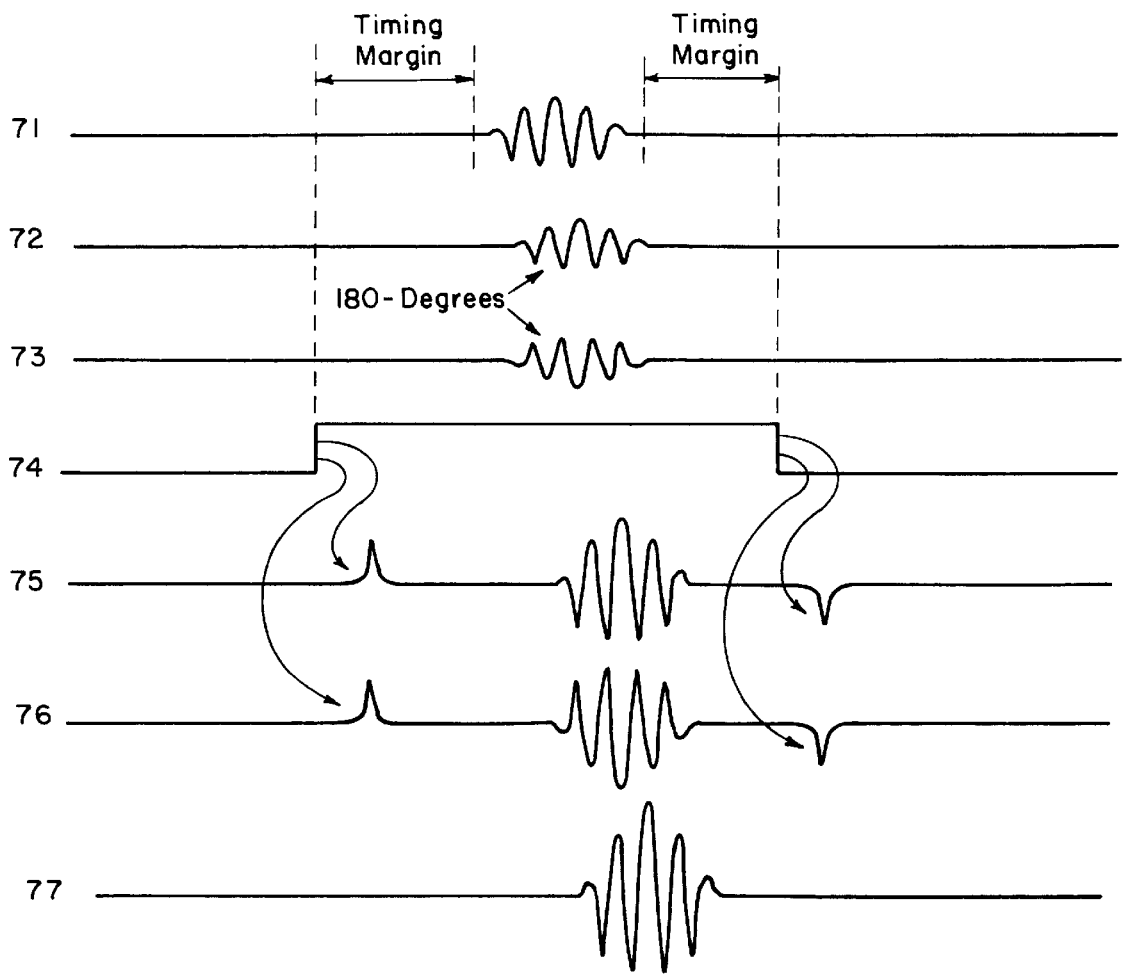
FIG. 7 depicts exemplary waveforms associated with a gated balanced amplifier designed according to an aspect of the present invention.

Referring to FIGS. 6 and 7, a low-level ultra wideband RF signal 71 (FIG. 7) is applied to RF input 61 (FIG. 6). This input signal passes through a 180-degree power splitter 610, such as, for example, a wire-wound transformer. It is known in the art that other power splitting implementations exist. For example, transmission line transformers, baluns, or hybrid couplers may be used. The output of power splitter 610 connects to nodes 62 and 63. The relative phase angle between the signals at nodes 62 and 63 is ideally 180-degrees, as shown by waveforms 72 and 73. In some cases, signals 72 and 73 are phase-shifted by +/−90 degrees with respect to the input signal 71; however, a 180-degree phase difference is preferred between signals at nodes 62 and 63. The phase difference, however, between these signals may, for example, also be zero degrees and 180 degrees with respect to input signal 71.

Following the split into two 180-degree relative phase-shifted signals, substantially identical RF amplifiers 611 and 612 amplify each individual low-level signal. Preferably, these amplifiers are gated RF amplifiers suggesting that there is provision for a gate signal 74 applied to gate input 64. The purpose of the gate signal is to control the power mode of the amplifier. That is, there is a power-up mode in which the amplifier operates normally and a power-down mode in which the amplifier is disabled and has significantly reduced power supply current In FIG. 6, the amplifiers are commercially available Microwave Monolithic Integrated Circuits (MMICs).

Figure 1A:
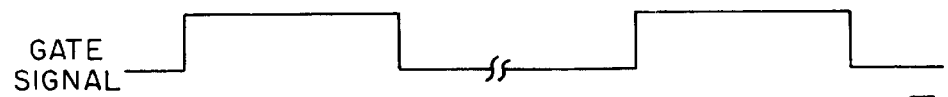
FIGS. 1A and 1B depict low duty-cycle high frequency signals associated with a prior art gated UWB power amplifier.
Figure 1B:
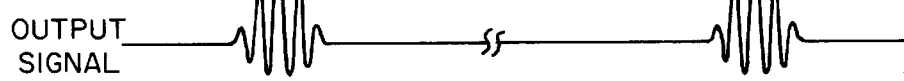
Figure 2:
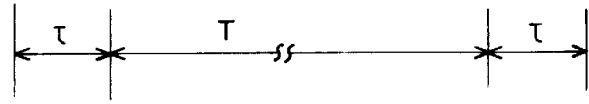
FIG. 2 depicts typical waveforms associated with a prior art gated amplifier with attention drawn to the spurious output signal that may be caused by transitions of the gate control signal.
Figure 2:
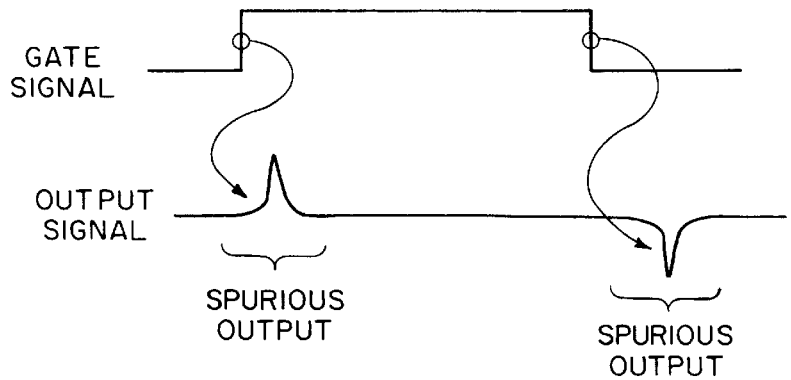
Figure 3A:
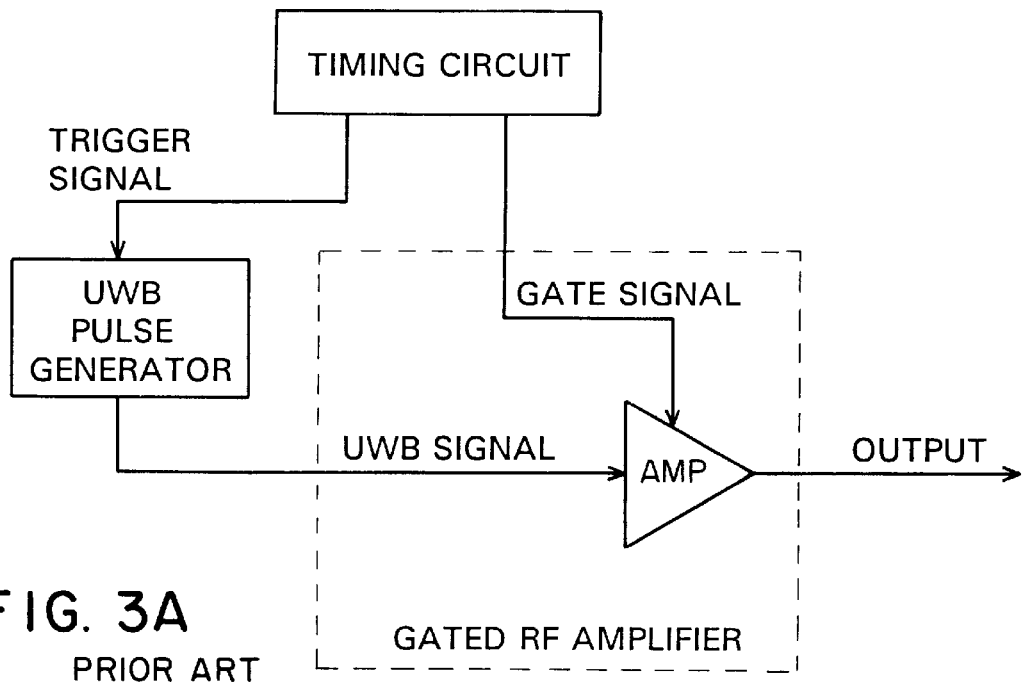
FIGS. 3A and 3B respectively illustrate a block diagram of a prior art UWB transmitter with a gated RF amplifier and an associated set of output signals.
Figure 3B:
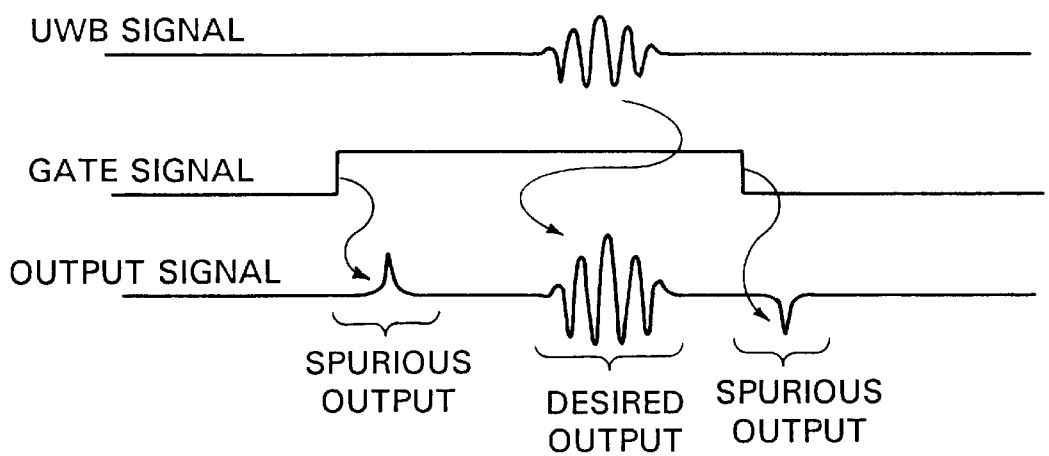
Figure 4:
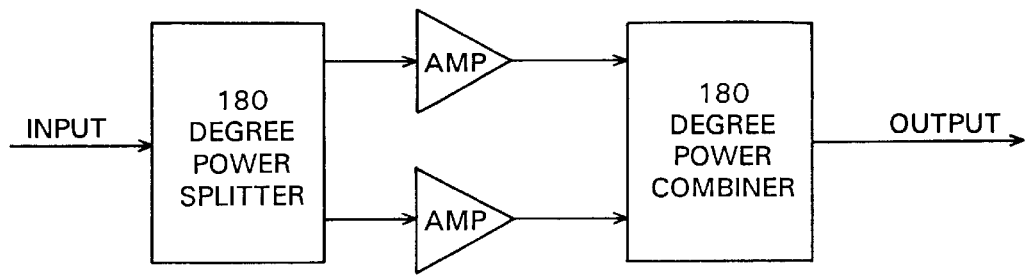
FIG. 4 is a block diagram of a prior art balanced amplifier.
Figure 5:
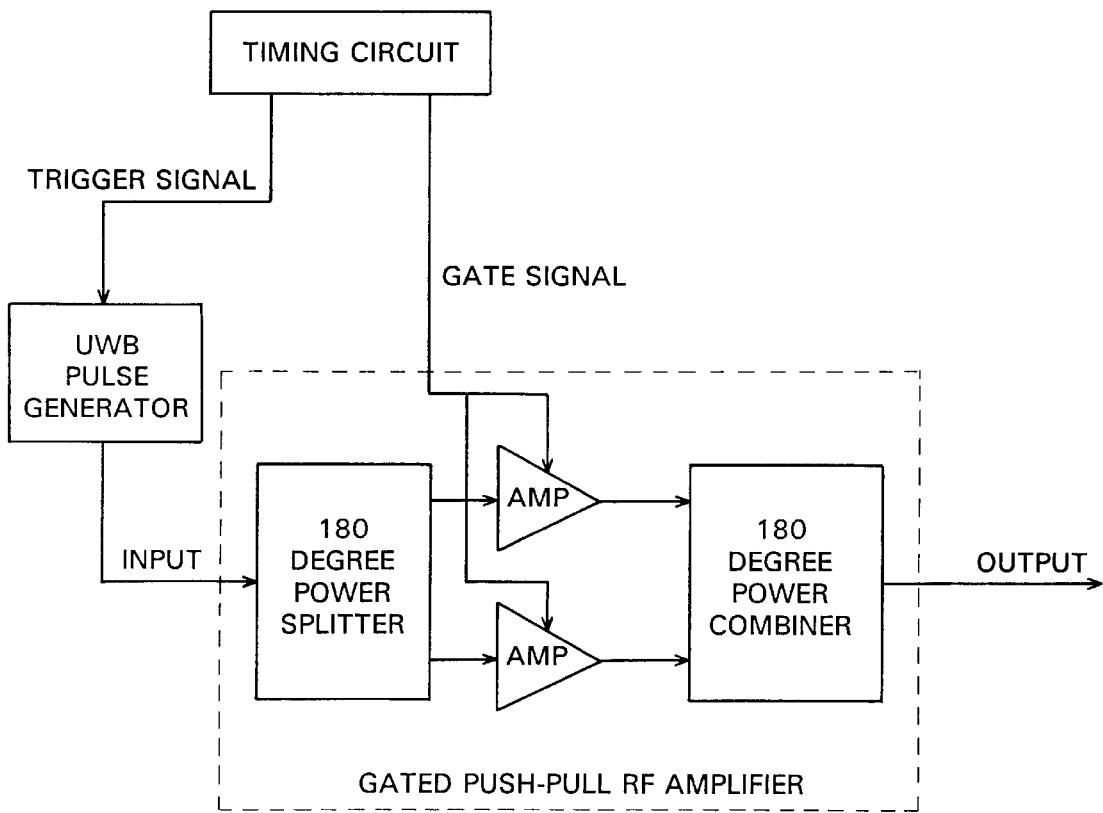
FIG. 5 is a block diagram of a gated balanced amplifier that is designed according to one aspect of the present invention.

FIG. 5 shows a timing circuit that controls the timing of gate signal 74 and low-level RF input signal 71 illustrated in FIG. 7. The timing is such that the gate signal 74 overlaps the timing of the RF signal 71. That is, gate signal 74 powers-up or activates the amplifier prior to the arrival of RF input signal 71 with a sufficient timing margin to allow the amplifier to stabilize. Similarly, gate signal 74 also powers-down or deactivates the amplifier with sufficient timing margin to insure that the RF input signal burst 71 has subsided.

Referring again to FIG. 6, amplifier output nodes 65 and 66 are coupled to the inputs of 180-degree power combiner 613, which is typically identical to power splitter 610, but used in reverse. Like the power splitter, combiner 613 may also have other implementations. Combiner 613 combines the signal at node 65 (waveform 75) with the signal at node 66 (waveform 76) to produce an RF output at node 67 (waveform 77). Of significance, the in-phase signals applied to the inputs of a 180-degree combiner are essentially cancelled. Signals applied to the combiner that are 180-degrees out of phase with respect to each other will essentially add constructively. The 180-degree combiner is such that the in-phase spurious signals produced by the turn-on or turn-off are substantially cancelled. By using a corresponding 180-degree power splitter, the wideband input signal is amplified as desired. Therefore, the low-level wideband RF input signal is amplified and produced at the output. Assuming the gated amplifiers 611 and 612 are substantially identical, the spurious output signals generated by power-up and power-down from each individual amplifier will be substantially identical; hence, in phase with each other. Thus, these spurious signals will substantially cancel at the output of combiner 613.

Power splitters and combiners are commercially available components that may be obtained from suppliers including Mini Circuits and Synergy Microwave, as known in the trade. Alternatively, these components may be integrated directly into the printed circuit board design in the form of transmission line transformers, as explained in Chapter 6 of *Design of RF Microwave Amplifiers and Oscillators* by Pieter L. D. Abrie, Artech House, 1999. A quarter-wavelength transmission line transformer is called a balun, and this can also be used as a power splitter or combiner. Yet another alternative is to use 180-degree hybrid couplers. An example 180-degree hybrid coupler is described in U.S. Pat. No. 3,946,339. Another example of a 180-degree hybrid coupler may be found in *Uniplanar Hybrid Couplers Using Asymetrical Coplanar Stiplines* by Heimer, et al.—IEEE Transactions on Microwave Theory and Techniques, Vol. 45, No 12, December 1997.

Figure 8A:
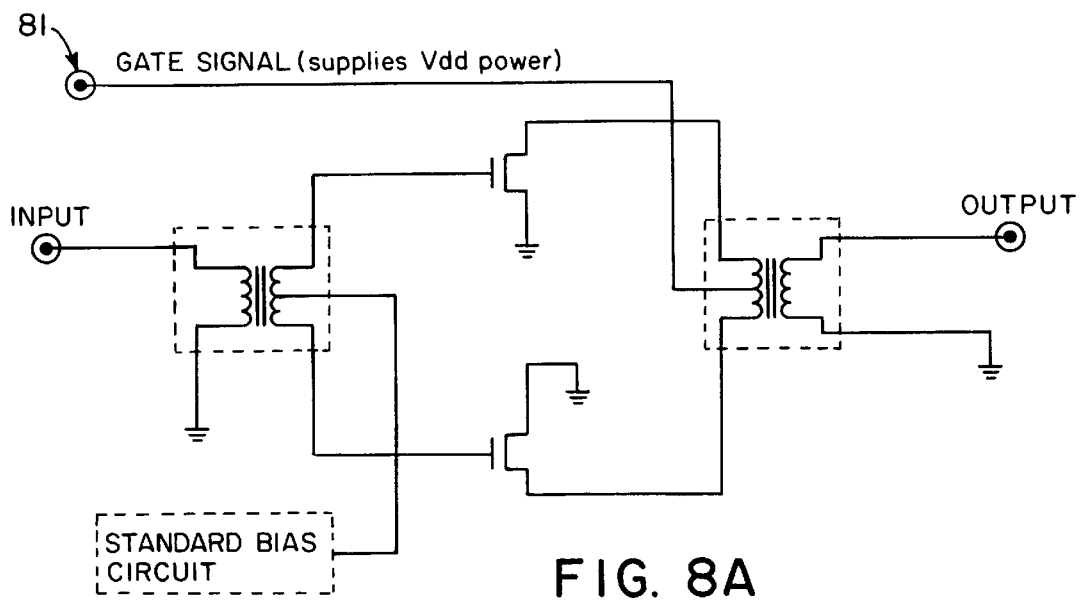
FIGS. 8A and 8B show other exemplary embodiments of the present invention.
Figure 8B:
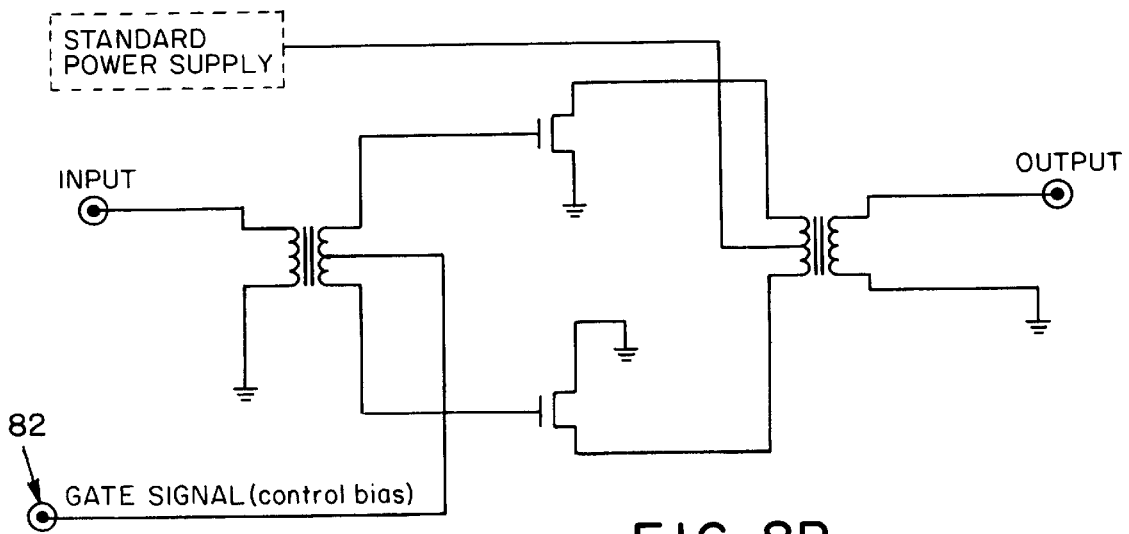

FIGS. 6 and 7 illustrate the construction of a gated push-pull amplifier incorporating MMIC RF amplifiers. The commercially available MMIC RF components advantageously provide a power-down control pin. One skilled in the art will recognize that there are alternate embodiments of a gated RF push-pull amplifier. For example, a gated push-pull amplifier can also be constructed from transistors, as shown in FIGS. 8A and 8B. In the case of FIG. 8A, the gating function is implemented by supplying a gate pulse to power supply input 81. In the case of FIG. 5B, power-up and power-down are selected by controlling the transistor bias.

While the invention has been described with reference to exemplary or preferred embodiments, those skilled in the art will be able to make the various modifications to the illustrated embodiments of the invention without departing from the true spirit and scope of the invention.

What is claimed is:

1. A UWB transmitter that includes a gated push-pull amplifier to generate a UWB transmission having reduced spurious outputs, said transmitter comprising:
   a signal splitter that divides a low-level UWB input signal into first and second signals of substantially opposite phase relationship,
   respective first and second amplifier segments of said push-pull amplifier that amplify the first and second signals to produce amplified output signals having a substantially opposite phase relative to each other;
   a switch responsive to a gate signal to activate the amplifiers prior to receiving the first and second signals; and
   a combiner that combines the amplified output signals of substantially opposite phase relationship whereby to provide a UWB signal transmission having reduced in-phase spurious output signals associated with activating said amplifiers.

2. The UWB transmitter of claim 1, further including a source of power responsive to said gate signal to activate said amplifiers.

3. The UWB transmitter of claim 1, wherein a bias input of said amplifier is coupled to said gate signal.

4. The UWB transmitter of claim 1, wherein the signal splitter comprises one of a wire-wound transformer, a transmission line transformer, a balun, and a hybrid coupler.

5. The UWB transmitter of claim 4, wherein the combiner further comprises one of a wire-wound transformer, a transmission line transformer, a balun, and a hybrid coupler.

6. The UWB transmitter of claim 1, wherein said switch responds to the gate signal to deactivate the amplifiers after receiving the first and second signals.

7. In a UWB system, a push-pull amplifier comprising:
   a signal splitter that receives signal energy at an input thereof and partitions the signal energy into first and second signals of substantially opposite phase relationship;
   respective amplifier segments that amplify the first and second signals to produce first and second amplified signals;
   a switch responsive to a gate signal to activate the amplifiers before the amplifier receives the first and second signals; and
   a signal combiner that combines the first and second amplified signals whereby to provide a composite output signal having reduced spurious signal output.

8. The push-pull amplifier of claim 7, further including a source of power responsive to said gate signal to activate said amplifiers.

9. The push-pull amplifier of claim 7, wherein a bias input of said amplifier is coupled to said gate signal.

10. The push-pull amplifier of claim 7, wherein the signal splitter comprises one of a wire-wound transformer, a transmission line transformer, a balun, and a hybrid coupler.

11. The push-pull amplifier as recited in claim 10, wherein the signal combiner further comprises one of a wire-wound transformer, a transmission line transformer, a balun, and a hybrid coupler.

12. The push-pull amplifier as recited in claim 7, wherein said switch is responsive to said gate signal to deactivate the amplifier after receipt of the first and second signals.

13. An ultra wideband radio frequency transmitter comprising:
    an amplifier;
    a UWB source that provides a short-pulse radio frequency signal in response to a trigger signal;
    a timing circuit that controls activation of the amplifier during a UWB pulse generation interval to reduce inter-pulse power consumption outside of the interval;
    a first transformer for delivering signal energy at said output along first and second paths to create signals substantially opposite in phase;
    respective amplifiers disposed in said first and second paths; and
    a second transformer that combines signals in the first and second path signals to provide a composite output signal, whereby to provide cancellation of spurious signal energy.

14. The ultra wideband transmitter as recited in claim 13, wherein said first and second transformers comprise one of a wire-wound transformer, a transmission line transformer, a balun, and a hybrid coupler.

15. The ultra wideband transmitter as recited in claim 14, wherein the timing circuit periodically activates the amplifier during UWB pulse detection intervals in cadence with pulses produced by the UWB source and said gate signal is produced at time instances to reduce the effects of spurious signals associated with the pulse detection intervals.

16. A method of reducing spurious signal outputs in a UWB system that generates a UWB pulse during a time interval defined by switching events, the method comprising:
    splitting UWB signal energy into signals of opposite phase,
    push-pull amplifying the signals during switching events thereby to produce amplified signals, and
    combining the amplified signals, whereby to reduce said spurious signal outputs.

17. A method of reducing spurious signal outputs in a UWB system that detects a UWB pulse during a time interval defined by switching events, the method comprising:
    splitting signal energy into signals of opposite phase,
    push-pull amplifying the signals during switching events thereby to produce amplified signals, and
    combining the amplified signals, whereby to reduce said spurious energy.

* * * * *